United States Patent [19]

Stack et al.

[11] 4,340,881
[45] Jul. 20, 1982

[54] UNIVERSAL ANALOG SIGNAL TO DIGITAL SIGNAL INTERFACE

[75] Inventors: Timothy F. Stack; George T. Shoemaker, both of Enfield, Conn.

[73] Assignee: United Technologies Corporation, Hartford, Conn.

[21] Appl. No.: 158,860

[22] Filed: Jun. 12, 1980

[51] Int. Cl.³ .................................... H03K 13/02
[52] U.S. Cl. ..................... 340/347 R; 340/347 AD; 340/347 M; 340/347 SY
[58] Field of Search ..... 340/347 R, 347 AD, 347 SY, 340/825.07, 825.1, 825.11, 825.21, 825.15, 870.03, 870.13, 870.21; 364/427–435; 318/594, 605, 659–661; 244/75 R, 76 R

[56] References Cited

U.S. PATENT DOCUMENTS

3,764,983 10/1973 Stok ................................ 340/825.15
4,255,743 3/1981 Guenin .......................... 340/347 SY Primary Examiner—Thomas J. Sloyan
Attorney, Agent, or Firm—Dominic J. Chiantera

[57] ABSTRACT

A universal analog signal interface includes a pair of signal conditioning circuits, each responsive to one of a pair of analog signals presented between two inputs of each for providing corresponding pairs of output signal manifestations representative of the magnitude and the phase of the pair of signals received; the analog interface further including signal conversion circuitry responsive to each of the pairs of signal manifestations of magnitude and phase for providing a digital signal representative of the ratio of the smaller magnitude signal manifestation divided by the larger magnitude signal manifestation and for providing digital signals representative of each of the phase signal manifestations.

3 Claims, 4 Drawing Figures

| DISCRETE STATES | | | SYNCHRO ANGLE α = |
|---|---|---|---|
| $M_{xz}$ | $\phi_{xy}$ | $\phi_{zy}$ | |
| 0 | 0 | 0 | $150° + \tan^{-1}\left[\frac{1-2\cdot R}{\sqrt{3}}\right]$ |
| 0 | 0 | 1 | $330° + \tan^{-1}\left[\frac{1+2\cdot R}{\sqrt{3}}\right]$ |
| 0 | 1 | 0 | $150° + \tan^{-1}\left[\frac{1+2\cdot R}{\sqrt{3}}\right]$ |
| 0 | 1 | 1 | $330° + \tan^{-1}\left[\frac{1-2\cdot R}{\sqrt{3}}\right]$ |
| 1 | 0 | 0 | $90° - \tan^{-1}\left[\frac{1-2\cdot R}{\sqrt{3}}\right]$ |
| 1 | 0 | 1 | $90° - \tan^{-1}\left[\frac{1+2\cdot R}{\sqrt{3}}\right]$ |
| 1 | 1 | 0 | $270° - \tan^{-1}\left[\frac{1+2\cdot R}{\sqrt{3}}\right]$ |
| 1 | 1 | 1 | $270° - \tan^{-1}\left[\frac{1-2\cdot R}{\sqrt{3}}\right]$ |

UNIVERSAL ANALOG SIGNAL TO DIGITAL SIGNAL INTERFACE

TECHNICAL FIELD

This invention relates to analog signal conditioning interfaces, and more particularly to an analog signal conditioner for converting ARINC-717 specified format analog signal information into a selected, processor compatible digital signal format.

BACKGROUND ART

As known, airborne integrated data system (AIDS) include a data acquisition unit (DAU) for receiving sensed data presented as a variety of signal types including: discrete signal, analog signal, and digital signal formats, each received at a corresponding signal type interface within the DAU. The DAU conditions and converts the received data into a digital signal format compatible with the AIDS processor and stores the data in a direct memory access (DMA) for retrieval by the processor. The received information is further classified into various formats within each of the basic signal type classes. With regard to the analog signal interface the signals received may be AC or DC, each provided as either a sensed absolute value signal or as a ratiometric signal where the information is contained in the ratio of the actual sensed signal magnitude to the excitation source magnitude. Absolute value signals require only two wire inputs to the DAU, while the ratiometric signals require three input lines including: the actual sensed value signal, the excitation source signal magnitude, and the common signal ground. In addition, many of the sensed AC signals include phase information related to the signal's phase with respect to either another sensed signal, or to its source excitation signal. This adds another dimension to the requirements of the analog signal interface which must preserve both the magnitude and phase information during the signal conditioning and signal conversion process. All of this results in the prior art analog interfaces having a number of inputs and signal conditioning circuits dedicated to the various input signal formats.

One example of dedicated signal conditioning within the prior art analog interfaces is that associated with the signal inputs from the AC synchros which sense the actual angular position of various control surfaces on the aircraft, such as flaps, ailerons, rudder, etc. In contrast to the other types of input signals the synchro angle information resides contemporaneously in the relative magnitude and phasing between the line-to-line synchro stator voltages. As known, the rotor winding of each synchro sensor is energized with a known magnitude, reference AC voltage signal. The amplitude of the voltage signals induced in each of the synchro stator windings is dependent on the turns ratio between rotor and stator and on the synchro angle ($\alpha$); by comparing the amplitude and relative phase of the voltages induced in each of two stator windings the value of $\alpha$ is uniquely determined.

In the prior art synchro signal interfaces the stator winding voltages ($V_X$, $V_Y$, $V_Z$) are compared to provide two differential signals representative of the difference voltage between each of two stator windings with respect to the third stator winding selected as a reference. The differential synchro signals are sinusoids at the same frequency as the reference AC rotor signal, but with an amplitude which is modulated in dependence on the value of the synchro angle $\alpha$. The pair of differential signals are converted by a precision Scott T network into a pair of output voltage signals whose amplitudes are proportional to the sine and cosine of the synchro angle value. As known, the Scott T network includes a pair of precision, cross coupled closed loop operational amplifiers, each of which provides one of the pair of output voltage signals. The sine and cosine signals are then processed in any one of a number of known methods to extract the relative magnitude and relative phasing information which defines the synchro angle value. One method includes phase shifting the sine and cosine signals by known, opposite phase shift values. The difference magnitude between the two phase shifted signals is representative of the synchro angle value, and is obtained by converting the phase shifted signal to a pulse width modulated (PWM) signal with a duty cycle in dependence on the difference signal magnitude. The PWM signal is converted into a digital word by counting the number of known frequency clock pulses within the ON portion of the PWM signal. The total count value is directly proportional to synchro angle value and may be read directly as a digital word to the DAU signal processor. An alternative method is to ratio the sine and cosine signals into a tangent or cotangent equivalent, which is converted to a digital signal equivalent and transformed by the DAU signal processor into the Arc function to generate the synchro angle value.

The prior art use of the Scott T circuitry, in addition to the downstream precision circuitry required to accurately preserve the magnitude and phase information in the two output signals, not only represents an additional dedicated interface within the overall analog interface, but a costly one at that. The circuitry is unique to the conditioning of the input synchro signal alone and has no applied use in the signal conditioning or conversion of any of the other types of analog input information. The present generation of digital flight data acquisition units (DFDAU) as defined by ARINC-717 requires a universal type signal conditioning interface which can accommodate all of the various types of input signal formats without the use of dedicated input channels. As such, any channel input must be capable of accepting any input signal format, i.e. DC, AC ratio, three wire resistance probes and synchros.

DISCLOSURE OF INVENTION

One object of the present invention is to provide an analog signal conditioning interface having common signal conditioning and signal conversion circuitry responsive to signals presented at a related data receiving channel in any of the analog signal formats defined by ARINC-717. Another object of the present invention is to provide a synchro signal-to-digital signal converter which eliminates the use of a Scott T network. Still another object of the present invention is to provide a synchro signal-to-digital signal converter having zero synchro angle ambiguity.

According to the present invention, a universal analog signal interface includes a pair of signal conditioning circuits, each responsive to one of a pair of analog signals presented between two inputs of each for providing corresponding pairs of output signal manifestations representative of the magnitude and the phase of the pair of signals received; the analog interface further including signal conversion circuitry responsive to each of the pairs of signal manifestations of magnitude and phase for providing a digital signal representative of the ratio of the smaller magnitude signal manifestation divided by the larger magnitude signal manifestation and for providing digital signals representative of each of the phase signal manifestations, each at an output thereof. In further accord with this aspect of the present invention the signal conditioning circuits each include an absolute value circuit for providing each of the signal manifestations of magnitude as the absolute value of the associated one of the pair of input signals presented thereto. In still further accord with this aspect of the present invention, the signal conversion circuitry includes a ratiometric analog-to-digital (A/D) converter having dual signal inputs including an unknown signal input and a reference signal input, the conversion circuitry further including signal switching means responsive to the pairs of signal manifestations of magnitude from the pair of signal conditioner circuits for presenting the smaller magnitude signal manifestation in each pair to the unknown signal input and for presenting the larger magnitude signal manifestation to the reference signal input, the A/D converter providing the digital signal as the ratio of the unknown signal input value divided by the reference signal input value.

According to another aspect of the present invention, a synchro signal-to-digital signal converter for providing a digital signal representation of synchro angle value in response to sensed synchro signals representative of actual synchro stator voltage signals and actual synchro rotor voltage signals, includes an analog signal interface responsive to the sensed synchro signals for providing a digital signal representative of the ratio of the smaller of the difference signal magnitudes between each of two stator winding voltage signals and a third stator winding voltage signal selected as a reference, divided by the larger, and for providing discrete signal manifestations of the particular one of a plurality of successive ranges of synchro angle values associated with the sensed synchro signals received, the synchro to digital signal converter further including a signal processor responsive to the digital ratio signal and to the discrete signal manifestations of synchro angle range, for providing a signal representation of actual synchro angle value associated with the sensed synchro signal data received. In still further accord with this aspect of the present invention, the signal processor includes a memory for storing a plurality of identification signals, each identifying synchro angle value in terms of digital ratio signal value in an associated one of the plurality of successive ranges of synchro angle values defined by the discrete signal manifestations, the processor providing the signal representation of actual synchro angle value as that identified in dependence on the digital ratio signal value by the particular one of the plurality of identification signals selected in dependence on the discrete signal manifestations. In still further accord with this aspect of the present invention the discrete signal manifestations include a magnitude discrete signal for identifying each change in relative magnitude of the two difference signal magnitudes, and include two phase discrete signals for identifying the changes in relative phase of each of the difference signal magnitudes with respect to the actual synchro rotor voltage, the plurality of successive ranges of synchro angle values are each defined as the intervals within the total range of synchro angle value bounded by successive changes in magnitude and phase as indicated by the discrete signal manifestations.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 2:
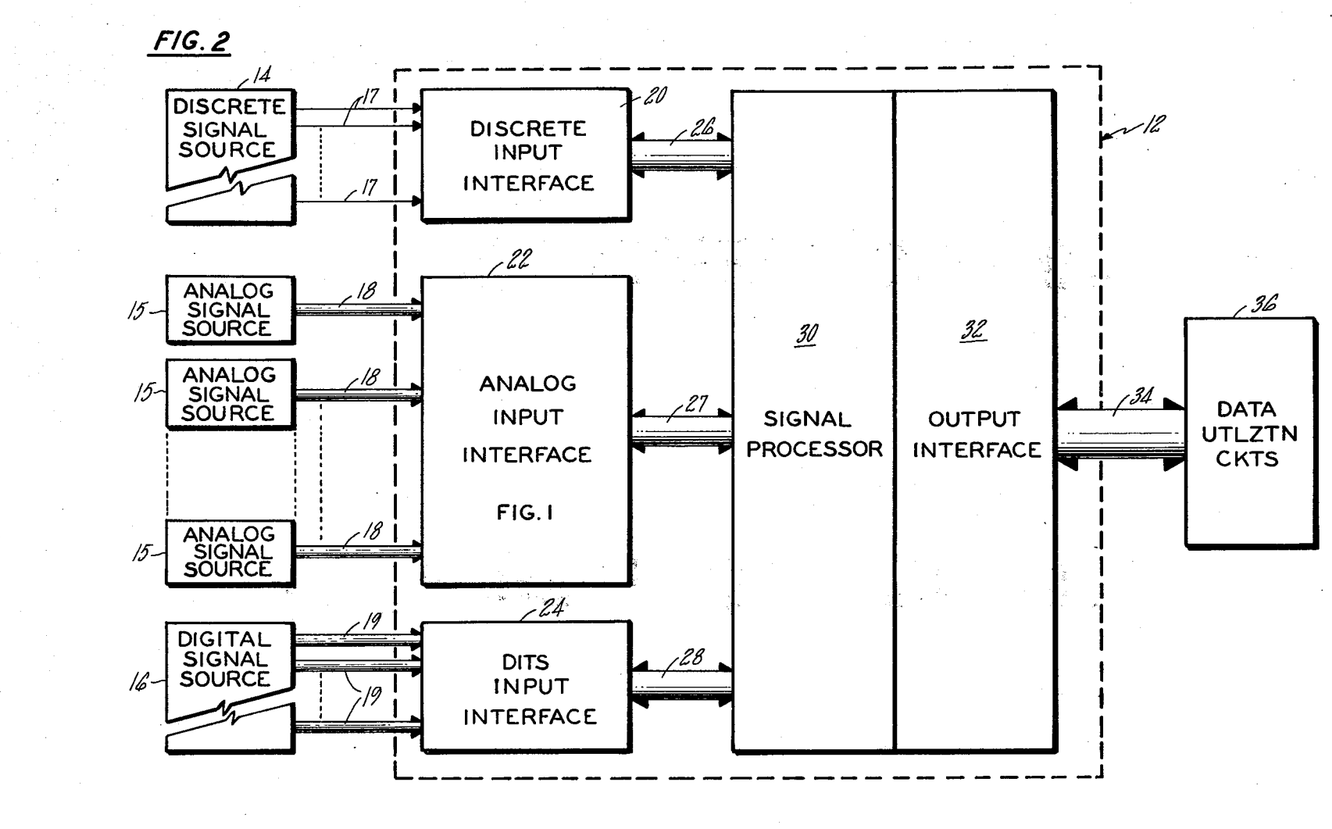
FIG. 2 is a simplified, system block diagram illustration of a data acquisition system utilizing the signal conditioning interface of FIG. 1.

Referring first to FIG. 2, a typical data acquisition unit (DAU) 12 receives input signal information from a plurality of different type signal sources, including: discrete signal sources 14, analog sources 15, and digital signal sources 16. The sources provide the various format input signals defined by ARINC-717 and present the input signals on lines 17–19 to the DAU. The signals are each received within the DAU at the corresponding one of the various signal type interfaces including a discrete signal interface 20, an analog signal interface 22, and a digital signal interface 24, each of which provide the signal conditioning and conversion of the received signals into the digital signal format required by the DAU signal processor. The conditioned signals are presented from the interfaces through lines 26–28 to the DAU signal processor 30, which organizes and processes the data as required by the system and presents the processed data through an output interface 32 and output lines 34 to the data utilization circuits 36.

The present invention relates to an analog signal conditioning interface 22 which includes a common signal conditioner/converter for use with each of the various types of analog input signal formats specified by ARINC-717. These include the various types of AC and DC signals, i.e. absolute value and ratio, and also the sensed synchro signal data from the aircraft's AC synchro sensors. The sensed synchro signal inputs are processed without the use of a Scott T network by converting the magnitude information from the sensed synchro stator voltages into ratiometric values and by converting relative phase information into signal bit discretes; all of which are read and processed by the DAU signal processor 30 to determine synchro angle value.

Figure 1:
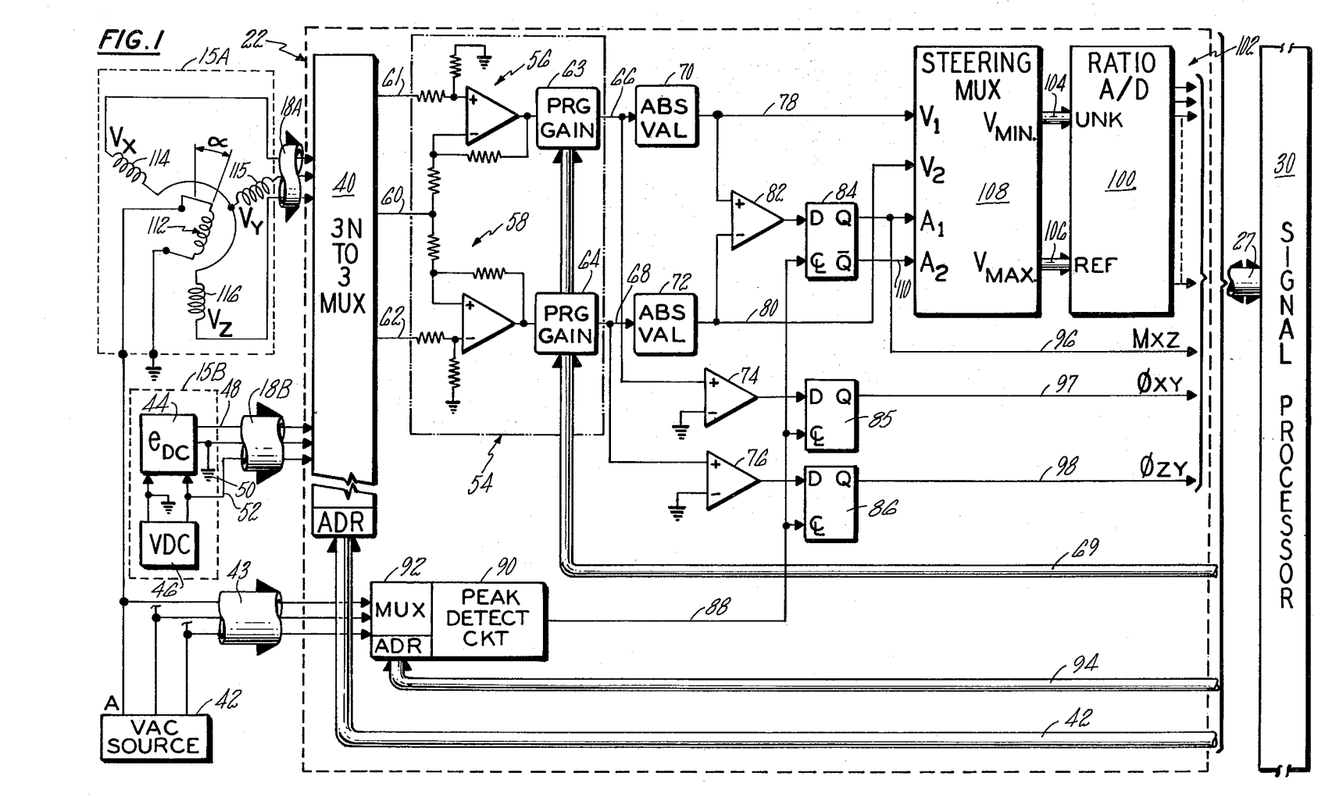
FIG. 1 is a system block diagram illustration of a best mode embodiment of an analog signal conditioning interface according to the present invention.

Referring now to FIG. 1, according to the present invention an analog signal conditioning interface 22 includes an input multiplexer (MUX) 40 responsive to the input analog signals from all of the N number of signal sources from which analog data is to be acquired. The MUX has a standard three wire input capable of accepting all of the various combinations of multiwire inputs defined by the ARINC-717 specification, and is a 3N-to-3 type where N is the total number of analog signal inputs to the DAU. Since a typical airborne DAU may have as many as sixty inputs the MUX 40 may in fact comprise a multiple number of parallel connected MUX switches. Although not shown in FIG. 1, the MUX may also include an input attenuator for scaling all of the input signal peak amplitudes (peak-to-peak) to the permissible operating voltage range of the MUX. The MUX is under address control by the DAU signal processor 30 which provides the address signals to the MUX through lines 41.

Only two types of input analog sources are shown in FIG. 1; an AC synchro sensor 15A and a DC sensor 15B. An interface data clock signal is derived from the aircraft three phase VAC source 42 which is presented to the interface through separate input lines 43. The source itself, or any one or more phases of the source, may also be included as part of the sampled data input to the MUX 40 e.g. as part of an AC ratiometric input signal. The synchro sensor is a nominal three wire input, whereas the DC sensor 15B is illustrated as comprising an absolute value signal sensor 44 in combination with the sensor's DC excitation source 46. The three wire input (18B) from the sensor 15B includes two wires from the sensor itself (the high signal output plus the signal ground) and the high signal side output from the excitation source 46. This allows the sensed signal output from the sensor 44 to be read by the DAU as a ratio of the sensed DC magnitude (e DC) to the magnitude of the excitation source (VDC). This ensures an accurate sense signal input since errors due to variations in magnitude of the excitation source are cancelled.

The three wire signal inputs are addressed sequentially by the MUX 40 and presented one at a time in successive sample time intervals to the input of a differential receiver 54 which includes a pair of closed loop operational amplifiers 56, 58. The inverting input of each of the amplifiers 56, 58 are connected to a common output line 60 from the MUX and the noninverting inputs are each connected to an associated one of the remaining two output lines 61, 62. As such, the receiver 54 includes a three wire input with the two wire inputs to each amplifier sharing a common input line. The amplifiers themselves are high gain operational amplifiers of a known type, such as the National Semiconductor LM148 which function as input buffers, or voltage followers, and are provided with a typical closed loop gain of unity. Each of the amplifiers provide a differential output signal indicative of the difference magnitude between the input signals received at the two input lines of each amplifier. In the best mode embodiment of FIG. 1, the receiver 54 also includes a pair of programmable gain amplifiers 63, 64, each responsive to the differential output signal from an associated one of the amplifiers. These programmable amplifiers are typically discrete stages which include an operational amplifier, such as the LM108A, strapped down with a plurality of selectable, switch actuated feedback paths. Each path provides a different signal gain for the differential signals, from the amplifiers 56, 58 to the receiver output lines 66, 68. The purpose of the programmable gain amplifiers is to accommodate the range of signal amplitudes among the various types of input signals to the interface, thereby maximizing the output scale factor of the interface for each type of input signal. The actual gain selected for the programmable amplifiers is dependent on the particular signal input presently being sampled, and is set by gate signals provided on lines 69 from the processor 30. Clearly the use of the programmable amplifiers is optional. The differential signals on the output lines 66, 68 of the receiver are presented to the input of an associated one of a pair of absolute value circuits 70, 72 and to an associated one of a pair of phase comparators 74, 76.

The absolute value circuits are precision full wave rectifiers of a known type which typically include dual operational amplifiers, and which do not include DC filtering. Filtering is not required since, as described hereinafter, the full wave rectified output signals from each circuit are combined in a ratiometric manner. The phase comparators 74, 76 are similarly of a known type, such as the National Semiconducter LM139 Quad Comparator Chip. Each of the phase comparators receive the associated output differential signal from the receiver 54 at the non-inverting input of each; the inverting input of each phase comparator is connected to signal ground.

The full wave rectified signals from the absolute value circuits 70, 72 are presented on lines 78, 80 to the non-inverting and inverting inputs, respectively, of a comparator 82, which may be identical to the comparators 74, 76. The outputs from each of the comparators 74, 76, 82 are connected to the signal input of an associated one of three bi-stable latches 84–86. The latches are also of a type known in art, such as D edge-triggered flip-flops. Each of the latches are triggered by a clock signal presented on a line 88 from a peak detect circuit 90 which detects the successive peak positive values of a selected one of the three phases of the aircraft VAC source 42. The particular phase is selected by an input MUX 92 under address control by the signal processor 30 through lines 94. Typically, the phase selected is that one of the three phases of the VAC source providing the excitation to the particular one of the input sources providing a present input signal. The output from the peak detect circuit 90 is a pulse train with a pulse repetition frequency equal to the source excitation frequency, which in turn defines the sample time interval for the DAU.

The true (Q) outputs from each of the latches 84–86 are presented through the lines 96–98 to the output of the analog interface, and through lines 27 to the signal processor 30. The true output from the latch 84 is the "magnitude" discrete $M_{XZ}$ which provides an indication of the relative magnitude of the two differential signals at the output of the receiver 54, on the lines 66, 68. With the comparator 82 connected as shown the magnitude discrete is set at a logic one state in response to the absolute value signal on the line 78 being greater than that on the line 80, and is set to a logic zero state for the opposite condition. The true outputs from the latches 85, 86 are "phase" discrete signals $\phi_{XY}$, $\phi_{ZY}$, each providing an indication of the relative phasing between the differential signals provided by the receiver 54, i.e. mutually in phase, or out of phase. As described hereinafter the phase discretes are used primarily in the processing of the sensed synchro data.

The actual value of the sensed input signal data is provided as a ratio of the smaller of the two absolute value signals on the lines 78, 80 divided by the larger. In the case of an absolute sensed signal i.e. the source 15B, this results in the absolute value signal being provided as the numerator and the larger magnitude, source excitation signal being included as the denominator. For the true ratiometric sensed input signals, the smaller value is always the numerator. As a result the ratio magnitude is always equal to, or less than unity.

The ratio signal is provided in the signal conversion circuitry of the interface, which includes a ratiometric analog-to-digital (A/D) converter 100 for providing a multiple bit digital signal representation of the ratio magnitude on the interface output lines 102 included with the discrete signal lines 96–98 in the lines 27 to the processor. The A/D is of a type known in the art, such as a triple ramp, integrating ratiometric type, which provides the output digital signal as the ratio of the signal magnitude presented on lines 104 to the UNKNOWN input divided by the signal magnitude presented on lines 106 to the REFERENCE input of the A/D. Since the relative magnitudes of the absolute value signals alternate with different sensed signal inputs, a "steering" MUX 108 in combination with the latch 84 determines the smaller/larger values of absolute values and steers them to the appropriate input of the A/D. The steering MUX is similarly of a known type, such as the Harris Model HI-201 CMOS switch, which is connected at two signal magnitude inputs $V_1$, $V_2$ to the outputs of the absolute value circuits on lines 78, 80, and which is connected at a steering address input $A_1$, $A_2$ to the true and $\overline{true}$ outputs of the latch 84. In operation, with the connection of the comparator 82 as shown in FIG. 1, a line 78 value greater than that on line 80 results in a steering input signal state of $A_1 = 1$, $A_2 = 0$ causing the MUX to switch the line 78 signal to the REFERENCE input and the line 80 signal to the UNKNOWN input. This corresponds to a logic one state for the magnitude discrete on line 96. For the opposite condition, the steering signal state $A_1 = 0$, $A_2 = 1$ results in lines 78, 80 connected to the UNKNOWN and REFERENCE input respectively, with the magnitude discrete at a logic zero.

In the processor, the ratio signal magnitude is compared with the scale, or range of anticipated ratio values associated with each particular parameter, all of which is defined in software to the processor. The ratio format provides highly accurate sensing of the true parameter value since it compensates for variations in the absolute value due to excitation source variations. This is true in both absolute sensed parameter input signals and in ratiometer inputs where the signals to be ratioed are derived from a common source. The use of the phase discrete signals on lines 97, 98 is associated with those particular input signals, such as the AC synchro input, where sensed phase information is required. When not needed the phase discrete signals are simply not read by the processor, otherwise the phase discretes are read together with the magnitude discrete and the digital ratio signal as part of the total word read out to the signal processor collectively through lines 27.

In the operation of the interface 22 in combination with the signal processor 30 to provide actual synchro angle values in response to input sensed synchro data representative of the actual synchro stator voltages and the actual rotor excitation, the interface provides the synchro signal to digital signal conversion in the same ratio format together with the magnitude and phase discretes described hereinbefore. This eliminates the Scott T network and, with the exception of precision absolute value circuits, the precision circuitry required to process the Scott T output signals. The synchro sensor 15A of FIG. 1 illustrates a typical synchro sensor configuration. The rotor 112 which rotates in agreement with the particular rotational element whose angular position is to be sensed is energized with one phase of the AC power bus; in FIG. 1 it is assumed that the rotor is energized by phase A which is then defined as the synchro reference ($V_{REF}$). The rotor winding voltage is defined as: $V_{REF} = V \sin \omega t$, where V is the peak value AC voltage magnitude and $\omega t$ is the frequency (typical 400 Hz). The voltage signals ($V_X$, $V_Y$, $V_Z$) induced in the three stator winding 114–116 are defined as: $V_x = \eta \cdot V_{REF} \cdot \cos(\alpha + 120°)$, $V_y = \eta \cdot V_{REF} \cdot \cos(\alpha - 120°)$, $V_z = \eta \cdot V_{REF} \cdot \cos \alpha$ and are presented through lines 18A to the MUX 40. In FIG. 1 it is assumed that the synchro stator voltage signal $V_Y$ is presented through line 60 to the differential receiver 54 and the stator voltage signals $V_X$, $V_Z$ are presented on lines 62, 64. In other words $V_Y$ is common to both amplifiers 56, 58, resulting in the input differential voltages $V_X - V_Y$ and $V_Z - V_Y$, respectively.

Figure 3:
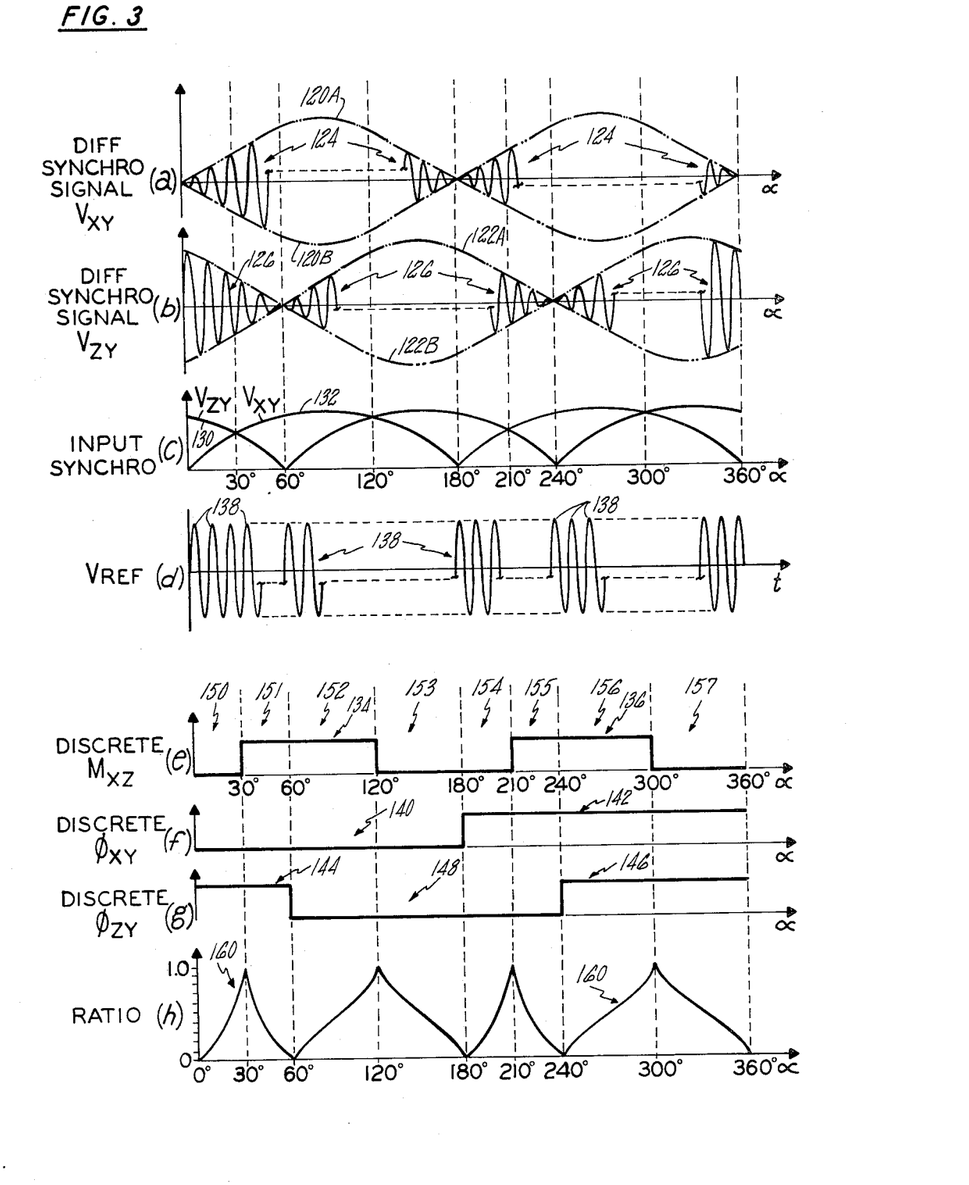
FIG. 3 is an illustration of various signal waveforms used in the description of the operation of the signal conditioning interface of FIG. 1 in providing synchro signal to digital signal conversion.

The output differential signals from the receiver on the lines 66, 68 are equal to: $V_{XY} = V_X - V_Y = K_T \cdot V_{REF} \cdot (-\sin \alpha)$ and $V_{ZY} = V_Z - V_Y = K_T \cdot V_{REF} \cdot \sin(\alpha + 120°)$ where $K_T = \eta \cdot \sqrt{3}$. In FIG. 3, illustrations (a), (b) depict the modulated amplitude of the two differential signals $V_{XY}$, $V_{ZY}$ over the 0° to 360° range of synchro angle ($\alpha$) values. The phantom wave form envelopes 120A, 120B and 122A, 122B represent the locus of peak positive and negative values of the modulated AC waveforms 124, 126 for the differential signals $V_{XY}$ and $V_{ZY}$ respectively. Illustration (d) shows the rotor $V_{REF}$ waveform 128. Comparison of the differential signal waveforms 124, 126 with the $V_{REF}$ waveform 128 indicates the change in phase of each differential signal over the synchro angle range. The differential signal $V_{XY}$, which is proportional to $-\sin \alpha$, is 180° out of phase with the $V_{REF}$ for synchro angle values between 0° and 180° and is in phase between 180° and 360°. The differential signal $V_{ZY}$ which is proportional to $\sin(\alpha + 120°)$ is in phase with $V_{REF}$ for synchro angle values between 0° to 60° and 240° to 360°, and 180° out of phase between 60° and 240°.

The differential signals are presented to the absolute value networks 70, 72 which provide on the output lines 78, 80 the full wave rectified DC equivalent of the modulated differential AC signals. In FIG. 3, illustration (c) the envelope i.e. the locus of peak positive values of the absolute value signals on the lines 78, 80 is illustrated by waveform 130 for the absolute value equivalent of $V_{ZY}$, and the waveform 132 for the absolute value of $V_{XY}$, each illustrating the change in amplitude of the differential signals with respect to synchro angle. As shown in illustration (c) the magnitude of differential signal $V_{ZY}$ (line 80) is greater than that of $V_{XY}$ for the initial range of synchro angle values between 0° and 30°. The crossover at 30° results in $V_{XY}$ being greater than $V_{ZY}$ over the succeeding interval between 30° and 120°, and the relative magnitudes of the two absolute value signals alternate over the range of synchro angle values, with crossover occurring at 30°, 120°, 210°, and 300°. Each of these crossover points results in a change in the state of the magnitude discrete signal $M_{XZ}$ on the line 96. Similarly the change in phase of each of the differential signals in illustrations (a) and (b) are detected by comparators 74, 76 and the latches 85, 86 establish the binary state of the phase discrete signals $\phi_{XY}$, $\phi_{ZY}$ on the lines 97, 98. As such the signal processor obtains magnitude and phase crossover manifestations for each of the differential signals over the full range of synchro angle values.

In FIG. 3, illustrations (e) through (g) indicate the binary state of the magnitude discrete signal $M_{XZ}$ and the two phase discrete signals $\phi_{XY}$, $\phi_{ZY}$ on the lines 96–98 to the processor 30. The discrete $M_{XZ}$ transitions at each of the magnitude crossover points; $M_{XZ}$ is at a logic one for synchro angle values in the range of 30° to 120° and 210° to 300°, i.e. those intervals in which as shown in (c) the absolute value of $V_{XY}$ is greater than $V_{ZY}$, and is at a logic zero state at all other times. Similarly, for the phase discrete signals, each latch is clocked at each positive peak value of $V_{REF}$ such that discrete $\phi_{XY}$ is at a logic zero (140) for the range of synchro angle values between 0° and 180° and at a logic one (142) between 180° and 360°. In the same manner $V_{ZY}$ is in phase with $V_{REF}$ for synchro angle values in the range of from 0° to 60° and from 240° to 360°, and is out of phase at all other values. The phase discrete $\phi_{ZY}$ manifests this with logic one states (144), (146) over the corresponding in phase portions and a logic zero (148) for the remaining portion. The combined total number of transitions in both magnitude and phase of the differential signals over the full 360° range of synchro values define eight intervals, or sub-ranges of synchro angle values; this results from four transitions of the discrete $M_{XZ}$, one transition for the discrete $\phi_{XY}$, and the two transitions for the discrete $\phi_{ZY}$. Each interval is uniquely defined by the combined logic states of the three discretes which provide a three bit signal indication which at any given time defines the particular one of the eight intervals 150–157 identified by the sensed synchro data. In the first interval 150 for $0° \leq \alpha \leq 30°$ the three bit signal resulting from the combined discretes $M_{XZ}$, $\phi_{XY}$, $\phi_{ZY}$ (reading from top to bottom in illustration (e)–(g)) is 0,0,1. For the second interval 152 the three discretes define a three bit 1,0,1, and so on through the entire 360° range of synchro values. Table I illustrates the discrete signal states versus sub-ranges of synchro angle values.

TABLE I

| $M_{XZ}$ | $\phi_{XY}$ | $\phi_{ZY}$ | $\alpha$ |
|---|---|---|---|
| 0 | 0 | 1 | 0°–30° |
| 1 | 0 | 1 | 30°–60° |
| 1 | 0 | 0 | 60°–120° |
| 0 | 0 | 0 | 120°–180° |
| 0 | 1 | 0 | 180°–210° |
| 1 | 1 | 0 | 210°–240° |
| 1 | 1 | 1 | 240°–300° |
| 0 | 1 | 1 | 300°–360° |

With the eight intervals or sub-ranges uniquely defined by the combination of the three discrete signals, each digital ratio signal from the A/D 100 may be identified as associated with a particular one of the eight sub-ranges. The processor 30 recognizes the sub-range defined by the three discrete signals. The actual synchro angle value $\alpha$ corresponding to each ratio signal magnitude within a defined one of the sub-ranges may then be determined through the use of trigonometric identities derived for each sub-range. The tabulation of FIG. 4 lists the trigonometric expression associated with each sub-range defined by the three bit combination of the three discrete signals. In the embodiment of FIG. 1, the trigonometric expressions are provided in terms of the Arc Tangent of the synchro angle $\alpha$, however, any other equivalent trigonometric function may be used. Each expression is valid for the values of synchro angle within the particular sub-range and each defines the synchro angle in terms of the ratio signal magnitude (R). The derivation of the trigonometric expressions associated with each sub-range is listed in Appendix A, and as indicated each of the eight expressions are derived directly from the equations for the synchro differential signals appearing on lines 66, 68.

Figure 4:
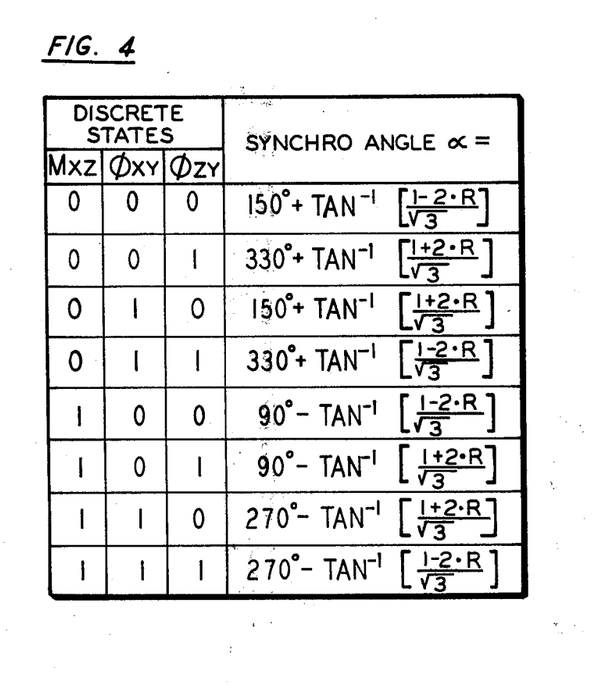
FIG. 4 is a tabulation of the operational parameters used by the signal conditioning interface of FIG. 1 in providing synchro signal to digital signal conversion in the data acquisition system of FIG. 2.

To illustrate the operation of the interface as a synchro to digital signal converter, assume at one sample time interval that the sensed input synchro data results in the output discrete signals $M_{XZ}$, $\phi_{XY}$, $\phi_{ZY}$ on the lines 96–98 identifying a 1,0,1 state, and the digital ratio signal on the lines 102 representing a 0.532 value. The interval defined by the discretes in FIG. 4 defines the synchro angle as:

$$\alpha = 90° - \text{Tan}^{-1}\left(\frac{1 + 2 \cdot R}{\sqrt{3}}\right).$$

For the ratio value R=0.532 the expression reduces to: $\alpha = 90° - \text{Tan}^{-1}(1.1917)$, or $\alpha = 40°$. In FIG. 3, illustration (h) the waveform 160 represents the locus of ratio signal magnitudes over the 360° range of synchro angle values. The waveform 160 is non-linear in each sub-range due to the characteristics of the tangent function, and the ratio magnitudes are all in the range of 0 to 1.0.

As stated before, the ratio format allows for cancellation of the common tolerances associated with the stator windings, i.e. source excitation, to provide for a more accurate determination of synchro angle value. The use of the analog interface as a synchro to digital converter also provides for the continuous ability to determine synchro angle. This results from the definition of the sub-range intervals by the discrete signals. Each interval defines a range of values spanning a maximum delta of 60° whereby the associated trigonometric equation avoids the discontinous segments of the Arc Tangent function. This ensures zero synchro angle ambiguity. In addition, the synchro conversion function is also insensitive to the transitional state of synchro angle values between adjacent intervals; the present invention providing a continuous transition in synchro angle value between each of these adjacent intervals.

The universal analog signal to digital signal converter of the present invention allows for the signal conditioning and conversion of each of the various types of analog signal formats defined by ARINC-717. The same signal conditioning circuitry is adapted for receiving either AC or DC, absolute sensed value or ratiometric values. The universal signal conditioner allows for the readout of each sensed input signal as a ratio value comprising either: two sensed signals that are related, or an absolute sensed signal value in ratio with the excitation source, thereby eliminating common inaccuracies due to the excitation source itself. In the operation of the universal signal conditioner as a synchro signal to digital signal converter, the present interface eliminates the use of the precision Scott T circuitry. Instead, the synchro stator voltages are converted to differential stator voltages signals which are ratioed to provide a ratio magnitude value which, in combination with the three discrete signals relating to magnitude and relative phase of the differential signals, provides definition of the synchro angle value throughout the total synchro angle range of values (0°–360°). In the ratio signal, the larger of the two input signals is always provided as the denominator of the ratio thereby ensuring a ratio equal to, or less than unity.

By treating the sensed synchro signal data as simple AC ratios, in combination with the discrete signal sensed states, the feasibility of a universal signal conditioner is realized. As a result all of the analog signals input into the DAU may be processed by common hardware, such that a minimal number of resident self test signals provide a high percentage of verification test. A secondary advantage of the present universal signal conditioner is the optimization of critical design factors, i.e. inherent cost, parts count, and associated weight, power, volume and reliability. This is due primarily to the consolidation of the synchro interface together with the remaining analog signal format interface and the elimination of the dedicated Scott T circuitry.

Similarly, although the invention has been shown and described with respect to a best mode embodiment thereof, it should be understood by those skilled in the art that various other changes, omissions, and additions may be made thereto without departing from the spirit and scope of this invention.

APPENDIX A

SYNCHRO DIFFERENTIAL SIGNALS:

(1) $V_{XY} = V_X - V_Y = K_T \cdot V_{REF} \cdot (-\sin\alpha)$; and
(2) $V_{ZY} = V_Z - V_Y = K_T \cdot V_{REF} \sin(\alpha + 120°)$;

where $K_T = \eta \cdot \sqrt{3}$ and
$V_{REF} = V \sin \omega t$.

DEFINE DISCRETE SIGNALS $M_{XZ}$, $\phi_{XY}$, and $\phi_{ZY}$ as follows:

(3A) $M_{XZ} = 1$, for $|V_{XY}| > |V_{ZY}|$;
(3B) $M_{XZ} = 0$, for $|V_{XY}| < |V_{ZY}|$;
(4A) $\phi_{XY} = 1$, for $V_{XY}$ in phase with $V_{REF}$;
(4B) $\phi_{XY} = 0$, for $V_{XY}$ out of phase with $V_{REF}$;
(5A) $\phi_{ZY} = 1$, for $V_{ZY}$ in phase with $V_{REF}$; and
(5B) $\phi_{ZY} = 0$, for $V_{ZY}$ out of phase with $V_{REF}$.

DEFINE RATIO SIGNAL R AS FOLLOWS:

(6A) $S \cdot R = S \left| \dfrac{V_{ZY}}{V_{XY}} \right|$; for $M_{XZ} = 1$ and (6B) $S \cdot R = S \left| \dfrac{V_{XY}}{V_{ZY}} \right|$; for $M_{XZ} = 0$, where:
(6C) $S = +1$; for $\phi_{XY} = \phi_{ZY}$ and
(6D) $S = -1$; for $\phi_{XY} \neq \phi_{ZY}$.

SUBSTITUTING EQ's (1), (2) into EQ (6A):

(7A) $S \cdot R = S \left| \dfrac{\sin(\alpha + 120°)}{-\sin\alpha} \right| = S \left| \dfrac{1}{2} - \dfrac{\sqrt{3}}{2} \cot\alpha \right|$,

THEREFORE (7B) $\cot\alpha = \dfrac{1 - 2 \cdot S \cdot R}{\sqrt{3}}$.

SOLVING FOR $\alpha$ IN TERMS OF THE ARC Tan:

(8) $\alpha = 90° - \tan^{-1}\left[ \dfrac{1 - 2 \cdot S \cdot R}{\sqrt{3}} \right]$; $30° \leq \alpha \leq 120°$, and (9) $\alpha = 270° - \tan^{-1}\left[ \dfrac{1 - 2 \cdot S \cdot R}{\sqrt{3}} \right]$; $210° \leq \alpha \leq 300°$.

SINCE $S = -1$ for $30° \leq \alpha \leq 60°$ and $210° \leq \alpha \leq 240°$:

(10) $\alpha = 90° - \tan^{-1}\left[ \dfrac{1 + 2 \cdot R}{\sqrt{3}} \right]$; $30° \leq \alpha \leq 60°$, (11) $\alpha = 90° - \tan^{-1}\left[ \dfrac{1 - 2 \cdot R}{\sqrt{3}} \right]$; $60° \leq \alpha \leq 120°$, (12) $\alpha = 270° - \tan^{-1}\left[ \dfrac{1 + 2 \cdot R}{\sqrt{3}} \right]$; $210 \leq \alpha \leq 240°$, and

APPENDIX A-continued (13) $\alpha = 270° - \tan^{-1}\left[ \dfrac{1 - 2 \cdot R}{\sqrt{3}} \right]$; $240° \leq \alpha \leq 300°$ SUBSTITUTING EQ's (1), (2) INTO EQ (6B):

(14A) $S \cdot R = S \left| \dfrac{-\sin\alpha}{\sin(\alpha + 120°)} \right|$

SUBSTITUTING $\theta = \alpha + 120°$:

(14B) $S \cdot R = S \left| \dfrac{-\sin(\theta - 120°)}{\sin\theta} \right| =$ $S \left| \dfrac{1}{2} + \dfrac{\sqrt{3}}{2} \cot\theta \right|$, THEREFORE (14C) $\cot\theta = \dfrac{1 - 2 \cdot S \cdot R}{\sqrt{3}}$.

RESUBSTITUTING $\theta = \alpha + 120°$ AND SOLVING FOR $\alpha$ IN TERMS OF THE ARC Tan:

(15) $\alpha = 330° + \tan^{-1}\left[ \dfrac{1 - 2 \cdot S \cdot R}{\sqrt{3}} \right]$;

$300° \leq \alpha \leq 30°$, and (16) $\alpha = 150° + \tan^{-1}\left[ \dfrac{1 - 2 \cdot S \cdot R}{\sqrt{3}} \right]$; $120° \leq \alpha \leq 210°$.

SINCE $S = -1$ FOR $0 \leq \alpha \leq 30°$ AND $180° \leq \alpha \leq 210°$:

(17) $\alpha = 330° + \tan^{-1}\left[ \dfrac{1 - 2 \cdot R}{\sqrt{3}} \right]$; $300° \leq \alpha \leq 360°$, (18) $\alpha = 330° + \tan^{-1}\left[ \dfrac{1 + 2 \cdot R}{\sqrt{3}} \right]$; $0° \leq \alpha \leq 30°$, (19) $\alpha = 150° + \tan^{-1}\left[ \dfrac{1 - 2 \cdot R}{\sqrt{3}} \right]$;

$120° \leq \alpha \leq 180°$, and (20) $\alpha = 150° + \tan^{-1}\left[ \dfrac{1 + 2 \cdot R}{\sqrt{3}} \right]$; $180° \leq \alpha \leq 210°$.

We claim:

1. Analog to digital signal interface for providing digital signal representations of AC and DC analog signal presented alternatively as two wire absolute value signals from an absolute value sensor excited by an associated sensor excitation source, and as three wire ratiometric signals from a common signal source, comprising:

signal switching means, connected for response to the signal outputs of the absolute value sensor and common signal source and to the sensor excitation source, for presenting pairs of output signals representing, alternately in response to the analog signal received, the pair of signals comprising each ratiometric input signal, and for each absolute value input signal, the absolute value signal and the excitation signal from the associated excitation source;

signal conditioning means responsive to said pairs of output signals from said switching means, for providing signal manifestations of each output signal magnitude and, in response to AC analog signal information, of each output signal phase; and signal conversion means, responsive to said signal manifestations of magnitude and phase from said signal conditioners, for providing a ratio digital signal representative of the smaller value signal magnitude manifestation divided by the larger value signal magnitude manifestation, for providing a phase digital signal for each signal manifestation of phase, and for providing a magnitude digital signal indicative of the relative values of said signal manifestations of magnitude.

2. The interface of claim 1, wherein
said signal switching means presents each pair of output signals on three output lines, including a common output line shared by each output signal of said pair; and wherein
said pair of signal conditioning means each comprise:
differential amplifier means, connected for response to said common output line and one of the remaining two of said three output lines for providing a differential signal representative of the difference magnitude between signals appearing at said responded to output lines; and
absolute value circuit means, responsive to said differential signals for providing uni-polar signal representative of the absolute value of each, said absolute value signal representing said signal manifestation of magnitude from said signal conditioning means.

3. The interface of claim 2, wherein said signal conversion means, comprises:
magnitude comparator means, connected for response to said absolute value circuit means in each of said signal conditioning means, for providing a magnitude discrete signal indicative of the magnitude of said absolute value signals;

phase comparator means, one for each differential amplifier means and each responsive at one input thereof to said differential signals and responsive at a second input to a reference phase signal, for providing a phase discrete signal indicative of the phase relationship between the responded to differential signal and said reference phase signal;

bi-stable switch means, one for said magnitude comparator means and each of said phase comparator means, each responsive to the discrete signals from the comparator associated therewith for providing said magnitude digital signal and said phase digital signals;

ratiometric analog-to-digital (A/D) converter, having an unknown signal input and a reference signal input, for providing a digital signal representative of the ratio of the unknown signal value divided by the reference signal value; and signal steering switch means, responsive at a signal input to the absolute value signals provided from said pair of signal conditioning means and responsive at an address input to said magnitude digital signal, said steering switch means presenting the smaller magnitude absolute value signal to said unknown signal input of said A/D converter and presenting said larger magnitude absolute value signal to said reference signal input in response to the value indication of said magnitude digital signal.

* * * * *